SOLID STATE RADIATION EMITTERS

Filed Aug. 16, 1963

INVENTOR.
HERBERT KROEMER

BY Paul B Hunter

ATTORNEY

United States Patent Office 3,309,553

Patented Mar. 14, 1967

3,309,553

SOLID STATE RADIATION EMITTERS

Herbert Kroemer, Sunnyvale, Calif., assignor to Varian Associates, Palo Alto, Calif., a corporation of California Filed Aug. 16, 1963, Ser. No. 302,647
20 Claims. (Cl. 313—108)

This invention relates to solid state radiation emitters, and in particular to novel and improved semiconductor devices that afford enhanced radiating characteristics.

Although the semiconductor device of this invention may be useful for various applications, the description will be directed to the use of the inventive device as a laser, for the purpose of description and explanation. It should be understood that the inventive concept is not limited to laser applications only.

Radiation or lasing action by semiconductors may be achieved in one way by the recombination of injected excess charge carriers. By exciting or stimulating certain semiconductors by means of light energy or electric current, these semiconductors will emit visible light, infrared, or other radiation.

However, radiating or lasing structures utilizing solid state devices have been limited to the direct gap type semiconductors, such as gallium arsenide, indium arsenide and indium phosphide, and to the semiconductor alloys $GaAs_xP_{1-x}$ and $Ga_xIn_{1-x}As$. It has not been possible to effect highly radiative recombination with the common semiconductors of the indirect energy gap type, such as Ge, Si, GaP for example, because a very high carrier injection level is required. The indirect gap type semiconductor is characterized in that an electron from the lowest energy state in the conduction band is not able to recombine radiatively with a hole in the highest energy state in the valence band. In order for the higher electron states to contain any electrons, it is necessary that very high carrier densities be injected, whereby the indirect gap semiconductors will be capable of emitting light by means of recombination.

Also, the presently known semiconductor radiation emitters or lasers are of the homojunction type, that is, the two sides of the PN junction are formed from a single semiconductor material. A homojunction structure cannot inject a higher carrier density than the doping density on the more heavily doped side of the semiconductor junction, and therefore, it is not possible to realize carrier densities or injection levels that are high enough to overcome the degeneracy threshold of the semiconductor, nor the even higher carrier densities needed to cause lasing in indirect gap semiconductors.

The degeneracy threshold may be defined as the injection level above which injected electrons fill more than half of the available electron states at the lower edge of the conduction band, and above which more than half of the electron states at the upper edge of the valence is empty, or filled with holes. The value of the degeneracy threshold varies with the semiconductor material being used. At room temperature, this value may be approximately $10^{18}$ carriers per cubic centimeter, by way of example. However, the degeneracy threshold decreases with a decrease in temperature, being approximately proportional to $T^{+3/2}$, where T is the absolute temperature. To achieve optimum efficiency, it is preferable to utilize an injected carrier density that is close to the degeneracy threshold. Furthermore, to accomplish coherent light emission, it is necessary that the injected carrier density be greater than the degeneracy threshold. Since only limited injection levels are possible with conventional PN junctions, such as found in the presently known semiconductor lasers, the degeneracy threshold must be lowered by extreme cooling of the structure to provide a suitable injection level.

Thus it is obvious that if high injection densities were provided, there would be no need for the extreme cooling of semiconductor lasers down to cryogenic temperatures. Also, if high injection densities were provided, indirect gap type as well as direct gap type semiconductors could be made to radiate or lase coherently, and at ambient or room temperatures.

Furthermore, with presently known semiconductor lasers having homojunctions, the light is radiated from the end of the junction in a direction substantially perpendicular to the current flow. It would be desirable, as an alternative, to obtain coherent light that is emitted transversely relative to the junction surface of the lasing body and in the direction of current flow so that the light emission covers a substantially wide area.

An object of this invention is to provide novel and improved solid state radiation emitters.

Another object of this invention is to provide high density injection light-emitting structures characterized by increased operating efficiency.

Another object is to provide solid state light emitters and lasers that can operate at ambient temperatures.

A further object is to provide coherent laser devices that afford wide area emission.

According to this invention, a solid state radiation emitter device comprises a semiconductor base, and means for injecting charge carriers of high density into such base and for preventing the outflow of the injected carriers from the base, so that the charge carriers may be efficiently utilized in a radiative recombination process.

In one embodiment of the invention, a solid state radiation emitter includes a thin base or support formed from a first semiconductor material having a relatively low energy gap, and injector electrodes formed from another semiconductor material disposed on each side of such base to form heterojunctions. The injector electrode material is heavily doped and has a substantially wider energy gap than the base material. The pair of wider energy gap injector electrodes are preferably of opposite polarity, one being P-type and the other N-type. An external source of power such as direct electric current, is coupled to the injector electrodes for supplying a forward bias voltage to the emitter device. Thus, excess charge carriers may be injected with a high density so that the degeneracy threshold of the base material is overcome at ambient or room temperatures with resultant emission of radiation. In this manner, a highly efficient light-emitting action is obtained by recombination radiation with indirect gap type semiconductors as well as with direct gap semiconductors at ambient temperatures.

In another embodiment of the invention, the injector electrodes are doped to have the same polarity, and suitable biasing means are coupled to the injector electrodes and to the base to provide high density carrier injection to the base.

In specific embodiments of the invention, reflective or opaque conducting electrodes are disposed on the emitter device so that radiation is directed in predetermined configurations and directions.

It is recognized that various configurations are possible within the scope of the invention whereby injector electrodes formed from a semiconductor material with a higher energy gap are disposed adjacent to a semiconductor base with a relatively lower energy gap, and energizing means are provided for actuating injection of high density charge carriers into the base. The injector electrodes are so located relative to the base that carrier outflow from the base and surface recombination are prevented.

The invention will be described in greater detail with reference to the drawing in which.

Similar numerals refer to similar parts throughout the drawing. It is to be noted that the figures of the drawing are merely illustrative, and that the parts are not represented in exact proportion.

Figures 1, 2, 3, 4, 5, 6, 7, 8, 9:
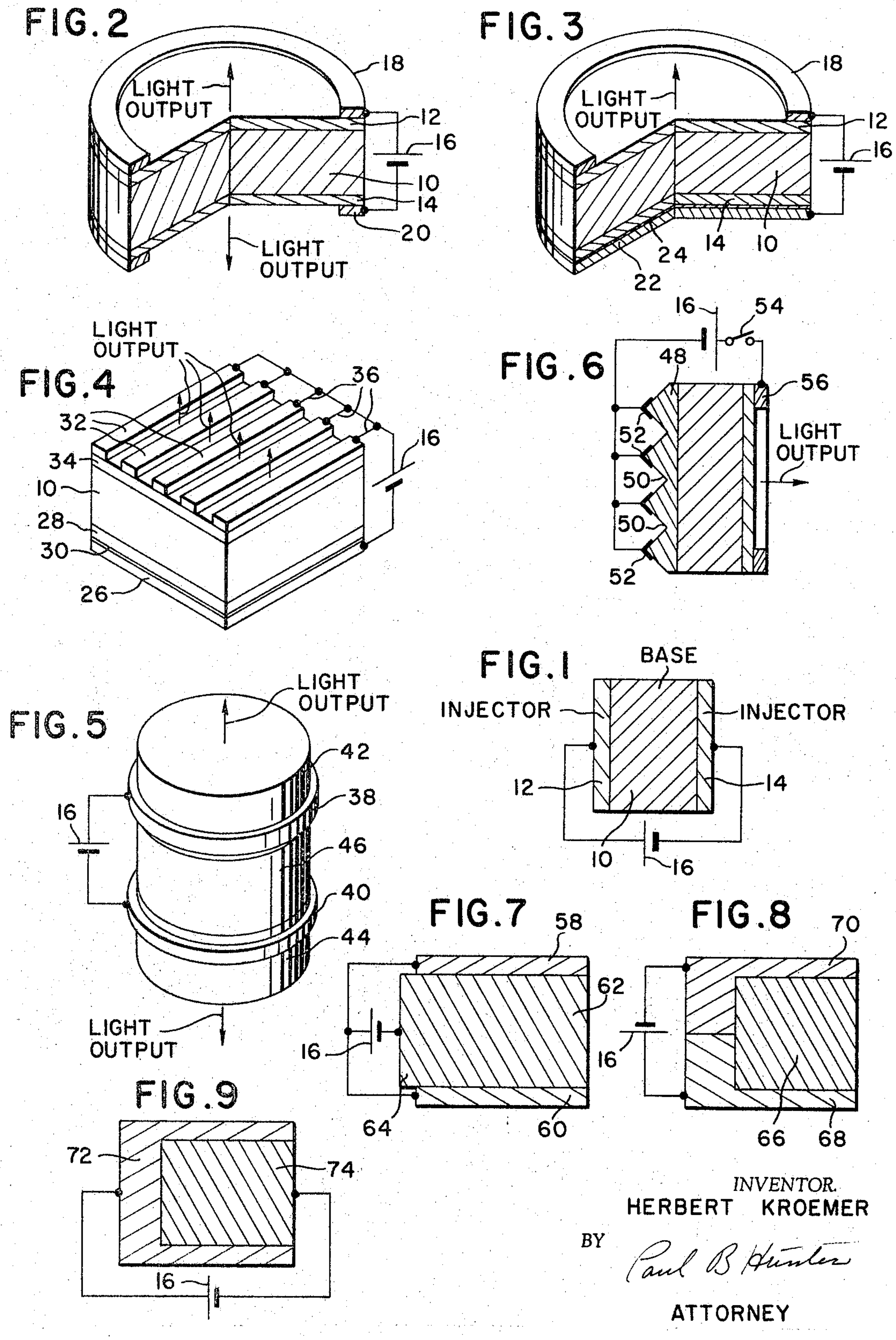
FIGURE 1 is a representational schematic diagram of a semiconductor laser, in accordance with this invention.
FIGURES 2 and 3 are isometric views, partly broken away, of embodiments of this invention.
FIGURES 4 and 5 are isometric views of alternative embodiments of the inventive structure.
FIGURE 6 is a sectional view of another alternative embodiment.
FIGURES 7–9 are representational schematic diagrams of other embodiments of the invention.

In the schematic diagram of FIGURE 1, a semiconductor radiation emitter structure, according to this invention, comprises a weakly doped base 10 formed from a lower energy gap material; a higher energy gap P-type injector electrode 12 on one surface of the base; and a higher energy gap N-type injector electrode 14 disposed on the opposite surface of the base 10. A direct current source 16 supplies a positive potential to the P-type injector electrode 12, whereas a negative potential is supplied to the N-type injector electrode 14.

In one embodiment of the invention, the lasing base 10 is formed from a single crystal germanium (Ge) wafer, and the injector electrodes 12 and 14 are made from gallium arsenide (GaAs) that has been suitably doped. The junctions formed between the dissimilar materials are referred to as heterojunctions, in contrast to homojunctions. When manufacturing the inventive laser utilizing these particular materials, a pair of layers of GaAs are grown on a germanium wafer or base having a thickness of about 100 microns or less.

The GaAs layers are formed by first preparing a melt consisting of gallium with a small percentage of arsenic. The arsenic content in the melt depends on the growing temperature, which may range from 350° to 750° C. by way of example. At a growing temperature of 500° C., a mixture comprising approximately 5 atomic percent of arsenic is used. The prepared melt is slowly heated to about 600° C. so that the arsenic reacts with the gallium to form GaAs. (Alternatively, an appropriate amount of GaAs may be dissolved in gallium to provide a suitable mixture.) In order to dissolve the residual arsenic that has not reacted, the melt is stirred repeatedly for the first ten minutes of the slow heating process. When the melt reaches about 600° C., the temperature is maintained for at least ten minutes to allow the excess arsenic to be evaporated, and to remove any condensation nuclei. The temperature of the melt is then reduced rapidly by about 100° C., within a period of less than ten minutes. When the temperature of the melt approaches approximately 500° C., the Ge wafer is quickly immersed into the supercooled melt.

The wafer acts as a seed so that the GaAs grows on the wafer support epitaxially. Before immersion, the Ge wafer is heated to a temperature higher than the melt, i.e. over 600° C., for example. The wafer is left in the melt for at least one minute and then withdrawn, providing a GaAs layer that is about 5–20 microns thick, for example. The above steps are performed in a reducing atmosphere, such as in pure hydrogen.

It is known that commercial arsenic contains impurities which produce only N-type GaAs injector electrodes. To increase the intensity of the N-type doping whereby higher injection levels are realized, an N-type dopant such as tin is added to the melt in a 1% proportion relative to the mixture.

However, in order to obtain a highly efficient semiconductor laser, one of the two GaAs layers is preferably made as a P-type injector electrode 12 by diffusing a P-type dopant such as zinc therein. To introduce the Zn into the GaAs layer, the base wafer and Zn doping material are heated within an evacuated quartz ampoule at about 800° C. for about one hour. The Zn dopant may comprise an alloy of 90% indium and 10% zinc, where the zinc is the primary diffusant and the indium acts as a buffer to prevent excess Zn vapor pressure. In order to retain the N-type doping of the other GaAs injector electrode, the N-type layer is masked with a film of evaporated or vapor-deposited $SiO_2$ prior to the introduction of the Zn dopant. The Zn diffuses rapidly in the exposed GaAs layer, but relatively slowly in the Ge wafer, and the diffusion virtually stops at the Ge-GaAs junction interface. After diffusion, the $SiO_2$ masking film is removed from the N-type layer with hydrochloric acid.

An alternative method of forming the semiconductor laser structure, with opposite polarity injector electrodes disposed on each side of a lasing base, employs a pair of Ge wafers that are placed back-to-back in a GaAs solution. N-type GaAs is grown on the exposed side of each wafer, while the surfaces that are positioned closely adjacent to each other are maintained unwetted. The edge surfaces also remain unwetted by coating the wafer edges with colloidal graphite. After growing suitable N-type injector electrodes, the wafers are then placed in a second GaAs solution that has been made P-type by adding one percent Zn, with the two coated N-type grown layers closely adjacent to each other in a back-to-back position. The P-type injector electrodes are then grown, and the graphite coating is subsequently removed from the edges of the two wafers. It is recognized that laser structure with injector electrodes may be produced by vapor epitaxy techniques.

After growing the injector electrode layers of opposite polarity, the structures are cut or cleaved to a desired shape or size, such as illustrated in FIGURES 2–6. Suitable conducting electrodes 18 and 20 are formed on the injector electrodes by evaporation, plating or other known means in any desired configuration, using screening or masking techniques. The electrodes may be formed by brushing or spraying silver paint or by evaporating thin conducting films, such as tin chloride or gold, in a well-known manner. The conducting electrodes may be made opaque or light-transmitting; or may be formed as a combination of opaque and transparent areas to allow selective areal transmission of light.

Various structures incorporating the inventive combination are shown in FIGURES 2–6. With reference to FIGURE 2, an embodiment of the invention includes a disk-like base structure 10 (shown in part) sandwiched between a P-type injector electrode 12 and N-type injector electrode 14. Annular conducting electrodes 18 and 20, which may be formed from silver paint, are disposed on the injector electrodes 12 and 14 respectively, and are connected to the terminals of a direct current supply 16. Upon application of D.C. current, for example 1.0 volt, radiation or light is transmitted transversely to the plane of the base disk 10. It is understood that the diameter of the base 10 may be of such length that the radiation is emitted radially from the base 10.

FIGURE 3 illustrates a laser structure similar to that of FIGURE 2, but provides a continuous conducting electrode 22 covering the entire surface of the N-type injector electrode 14. A reflecting layer 24, formed from aluminum, for example, that has been positioned between the N-type injector layer 14 and the conductive electrode 22 serves to reflect the light radiation towards the P-type layer 12, whereby the light is emitted unidirectionally through the layer 12.

An alternative embodiment shown in FIGURE 4 comprises a rectangular structure that includes a continuous conducting electrode 26 on the surface of the N-type injector electrode 28, and a reflective layer 30 disposed between the conducting electrode 26 and injector 28. A series of spaced opaque conductive strips 32, which may be formed by silver coating, are positioned on the P-type injector electrode 34. Positive potentials are supplied to each conductive strip 32 by means of electrical leads 36 coupled by a common connection to the positive terminal of the power supply 16, while a negative voltage is applied to the electrode 26. Thus, the light radiates in an array of spaced parallel beams through the exposed areas of the P-type injector electrode 34. It is apparent that cross grid arrangements as well as other configurations are possible for presenting a series of spaced laser beams. Furthermore, it should be noted that radiation may be emitted either transverse to current flow, or in the same direction as current flow depending on the geometric configuration and reflectivity characteristics of the device.

FIGURE 5 illustrates a cylindrical laser structure that has annular conductive electrodes 38 and 40 located around the periphery of P-type and N-type injector electrodes, 42 and 44 respectively, that are positioned on opposite surfaces of a base 46. The light output can be derived as a circular beam that is coaxially aligned with the cylinder.

In FIGURE 6, another embodiment of the invention comprises a structure characterized by an N-type layer 48 having a series of uniformly spaced grooves or ridges 50. The grooves 50 have a triangular cross-sectional shape, forming a 90° angle between the triangle sides, that may be formed by machining or other known methods. The surface of each groove 50 is coated with a conductive element 52, which may be formed by painting with silver, or by evaporating gold or tin chloride, by way of example. The conductive elements 52 are individually connected through a common connection to the power supply 16. The lasing structure may be energized by closing a switch 54 that is coupled between a circumferential conductive electrode 56, disposed adjacent to a P-type layer 58, and the power supply 16. The structure of FIGURE 6 may be formed as a series of rows of grooved elements, each row being individually controlled by a separate switch 54, **54*a*, 54*b*** . . . so that selective energization is possible. In this manner, data processing and image displays may be achieved. It should be noted that switches may be connected in the power supply for any of the other available structures, and is illustrated only in FIGURE 6 for the purpose of convenience. Various geometries and structures other than shown, may be fabricated in keeping with this invention.

FIGURES 7–9 illustrate other possible configurations that utilize the inventive combination to realize high density carrier injection into an indirect energy gap base accompanied by prevention of outflow of carriers from such base, so that highly efficient radiative recombination occurs.

In FIGURE 7, a pair of wide-gap P-type injector electrodes 58 and 60 are located on a narrow-gap N-type wafer base 62 that has a protruding portion 64 relative to one end of each injector electrode 58 and 60. A power supply 16 provides positive biasing voltage to the P-type injectors and a negative voltage to the N-type base 64.

In FIGURE 8, a semiconductor base 66, such as germanium, has wide-gap P-type and N-type injector electrodes 68 and 70 positioned adjacent to each other at one edge of the base. Radiation may be derived in the direction of current flow or orthogonal to this direction depending on the geometry of the structure and its reflectivity characteristics.

FIGURE 9 shows a similar configuration to that of FIGURE 8, but the injector electrode 72 is an integral P-type body and the base 74 is N-type. Suitable biasing potentials are supplied from the voltage source 16.

It will be understood that the scope of this invention is not limited to a combination of only Ge and GaAs, but encompasses the use of those relatively wide energy gap materials that can form heterojunction interfaces with a lower energy gap semiconductor material, and provide high density excess charge carriers to the lower energy gap material for producing radiation or lasing at ambient temperatures. A major consideration for realizing optimum radiating efficiency is the reduction of lattice dislocations that generally cause a drain and loss of nonequilibrium carriers, with a resultant reduction of radiative carrier recombination. Such dislocations are generated at the heretojunction interface if the two crystal lattices do not match perfectly. By utilizing semiconductors that have a close lattice match, dislocations at the interface that would result in non-radiative recombination of the charge carriers are effectively minimized. Also, by growing the base layer or wafer first, and then growing the injector electrodes onto the base, those dislocations that do appear are found inside the injector electrode structure and not in the lasing base itself, whereby there is no appreciable loss of recombination current occurring within the base.

In order to reduce the lattice misfit that may appear between the Ge and GaAs, the Ge may be homogeneously alloyed with about 1.5 to 3.5 atomic percent silicon, preferably about 1.8%; or the GaAs may be alloyed with a small amount of III–V compound with a higher lattice constant, for example with about 1% GaSb. Other combinations of a semiconductor base and semiconductor injector electrodes having close lattice matches may be employed following the teachings of this invention.

Applicant has determined that other combinations may be utilized to produce lasing structures, in accordance with this invention. For example, compounds formed from Group III and Group V elements of the periodic chart may serve as the radiaion emitting base. The injector electrodes may be made from III–V compounds or II–VI compounds. Close lattice matches to reduce dislocations at the interfaces of the junctions are desired.

*Example 1.*—A Group III–V compound such as GaP may serve as the base wafer, and a Group III–V compound such as AlP may be used for the injectors. In such case, the manufacturing process employs diffusion displacement of Ga in GaP by Al, by heating in Al vapor for 24 hours at 1200° centigrade. A mixture of 4.0% GaAs and GaP may be used in lieu of GaP only.

*Example 2.*—A Group III–V compound such as InSb may be utilized for the base, and a Group II–VI compound such as CdTe may form the injectors. This combination may be achieved by epitaxial condensation of CdTe vapor on InSb at 400° centigrade. The CdTe may contain 12% InAs or 13% ZnTe in mixture.

Generally, the scope of this invention encompasses the use of combinations containing Group IV, II–V, or II–VI semiconductors. The preferred semiconductors have a cubic lattice structure, or crystallize in either the diamond or in the zincblende lattice. The combination of semiconductors that are used should have lattice constants that differ by no more than 1%. However, it should be realized that although it is desirable to use semiconductors that have a low dislocation density (less than 100 $cm.^{-2}$) and a high minority carrier lifetime (greater than 100 $\mu$sec.), crystals with a high dislocation density and short lifetime may be used successfully. It is understood that alloying may be used to advantage with compounds selected from the groups described above to achieve a close lattice match and to improve radiation efficiency and lasing action.

Applicants have compiled a listing of semiconductors that indicates the relative misfits between compounds, as follows:

| Semiconductor | a/A. | Δa/A. |
|---|---|---|
| ZnS | 5.406 | .022 |
| Si | 5.428 | .022 |
| GaP | 5.450 | .01 |
| AlP | 5.46 | .17 |
| AlAs | 5.63 | .02 |
| GaAs | 5.653 | .005 |
| Ge | 5.658 | .009 |
| ZnSe | 5.667 | .16 |
| CdS | 5.83 | .02 |
| HgS | 5.852 | .017 |
| InP | 5.869 | .08 |
| CdSe | 6.05 | .01 |
| InAs | 6.058 | .026 |
| HgSe | 6.084 | .001 |
| ZnTe | 6.085 | .010 |
| GaSb | 6.095 | .040 |
| AlSb | 6.135 | .294 |
| HgTe | 6.429 | .050 |
| InSb | 6.479 | .00 |
| CdTe | 6.48 | |

The column headed by a/A. presents the approximate lattice constant for each semiconductor material, and the column headed by Δa/A. designates the misfit between adjacently listed semiconductors. Combinations having misfits less than or close to .01 are preferred when considering lattice matching. It should be noted that close misfits may be further reduced by proper alloying. Thus, it is seen that adjacent semiconductors, such as HgSe and ZnTe with a misfit of .001, may be employed in the inventive combination. Also, non-adjacent pairs, such as HgSe and GaSb, and GaAs and ZnSe by way of example can serve respectively, as base and injector combinations, in accordance with this invention. In the latter case, the ZnSe may be mixed with 5.4% ZnS for improving the lattice match. Other combinations that may be used as base-injector combinations to effect radiative recombination successfully are AlP–ZnS, CdSe–ZnTe, InAs–GaSb, and HgSe–AlSb, among others.

An analysis of the laser operation of the inventive structure of FIGURE 1, by way of example, reveals that when a forward bias voltage is applied from the power supply, a potential energy difference between the injectors and the base appears. As a result, electrons and holes are trapped in the central base region permitting very high injection levels to build up. The electrons will be substantially in equilibrium with the N-type injector, and will be governed by the Fermi level of the N-type injector; whereas the holes will be in equilibrium with the P-type injector and will be governed by its Fermi level. However, the principle of electro-neutrality requires that the two injected densities be equal, and thus the separations of the edges of the two bands from their respective Fermi levels must also be approximately equal. Since the Fermi level penetration in the base region exceeds that found in the injector electrodes, the injected carrier density in the base also exceeds the density in the injectors. The high injection levels or high carrier densities that are constituted in the base cause a population inversion, which may occur even across the direct gap in indirect gap semiconductors. This situation, however, will not occur with homogeneous type gap junction structures.

Generally, the light radiated from the emitting or lasing base escapes in a direction parallel to the longest path in the lasing base. This occurs because the intensity gain of the radiation being generated is greatest in the longitudinal or parallel escape mode. However, the optical Q for the parallel escape mode may be minimized or spoiled by beveling or roughening the edge or outer periphery of the lasing base, or by eliminating injection at these outer areas, thus making the base absorptive. Also, the use of reflecting layers as described virtually lengthens the radiation path in the transverse direction, and a high optical Q for the transverse escape mode is thus realized. In this manner, coherent emission over a much larger area can be obtained in the inventive laser than with presently known laser structures.

There has been described herein a novel solid state radiation emitter device that affords increased efficiency of coherent radiation over a wide area of emission. The radiation output may be obtained in the direction of current flow or orthogonal to such direction. Furthermore, the structure may be formed from common semiconductor materials, characterized by an indirect energy gap, as well as from those materials having a direct energy gap. In addition, the inventive light radiating device can be operated at ambient temperatures and requires only a low electrical power input for activation.

It should be noted that the structures, materials, and conditions and parameters set forth above are only illustrative, and that the scope of the invention is not necessarily limited thereto. Therefore, the invention encompasses various alternatives that may be utilized successfully in light of the teachings herein.

What is claimed is:

1. A heterojunction solid state optical frequency radiation device including at least two different types of semiconductor materials united together to form a heterojunction semiconductor body, one of said at least two different types of semiconductor materials forming an injector region and the other of said at least two different types of semiconductor materials forming a base region, said injector region including semiconductor injector regions disposed on opposite sides of said base region, said semiconductor injector regions having opposite types of conductivity relative to each other, said semiconductor material forming said injector regions having a larger forbidden band gap than said semiconductor material forming said base region, said semiconductor injector regions having higher doping levels than said base region, said injector and base regions being physically inter-related relative to each other and provided with bias means for injecting carriers from said injector regions into said base region such that carrier accumulation in said base region exceeds levels in excess of the doping levels of said injector regions while inhibiting carrier run-off from said base region into said injector regions.

2. The solid state radiation device defined in claim 1, wherein at least one of the semiconductors is an element found in Group IV of the Periodic Table.

3. The solid state radiation device defined in claim 1, wherein at least one of the semiconductors is formed from compounds of elements found in Groups III and V of the Periodic Table.

4. The solid state radiation device defined in claim 1, wherein at least one of the semiconductors are formed from compounds of elements found in Groups II and VI of the Periodic Table.

5. The solid state radiation device defined in claim 1, wherein at least one of the semiconductors is selected from the class that crystallizes in the zincblende lattice.

6. The solid state radiation device defined in claim 1, wherein at least one of the semiconductors is selected from the class that crystallizes in the diamond lattice.

7. The solid state radiation device defined in claim 1, wherein at least one of the semiconductors is formed from a homogeneous alloy mixture of at least semiconductors.

8. The solid state radiation device defined in claim 1, wherein the semiconductor base is gallium phosphide.

9. The heterojunction solid state optical frequency device defined in claim 1, wherein said base region is formed from a direct gap semiconductor material.

10. The heterojunction solid state optical frequency device defined in claim 1, wherein said base region is formed from an indirect gap semiconductor material.

11. The heterojunction solid state optical frequency radiation device defined in claim 1, wherein means are included in said device for causing reflection of recombination radiation generated in said device from a surface of said device.

12. The heterojunction device defined in claim 1, wherein the injector region on at least one side of said base region is provided with a ring shaped ohmic electrode which permits passage of generated optical radiation from said base region through said injector region and through the central portion of said ring.

13. The heterojunction device defined in claim 1, wherein said injector regions are degenerately doped.

14. The heterojunction device defined in claim 1, wherein said at least two different types of semiconductor materials have lattice constants that differ by 1% or less.

15. The heterojunction device defined in claim 1, wherein said base region is Ge and said injector region is GaAs.

16. The heterojunction device defined in claim 1, wherein at least one of said semiconductors is composed of an alloyed mixture.

17. The solid state radiation device defined in claim 16, wherein the germanium body consists essentially of a homogeneous alloy mixture of germanium and silicon.

18. The solid state radiation device defined in claim 16, wherein the mixture contains an atomic percentage of silicon in the range of approximately 1.5 to 3.5 percent.

19. A heterojunction solid state optical frequency radiation device including at least two different types of semiconductor materials united together to form a heterojunction semiconductor body, one of said at least two different types of semiconductor materials forming an injector region and the other of said at least two different types of semiconductor materials forming a base region, said semiconductor material forming said injector region having a larger forbidden band gap than said semiconductor material forming said base region, said semiconductor injector region having a higher doping level than said base region, said injector and base regions being physically inter-related relative to each other and provided with bias means for injecting carriers from said injector region into said base region such that carrier accumulation in said base region exceeds levels in excess of the doping level of said injector region while inhibiting carrier run-off from said base region into said injector region, at least a portion of said injector region being provided with a plurality of spaced conductive strips disposed thereon such that a plurality of ohmic junctions are formed which permit passage of generated optical radiation from said base region through said injector region between said spaced conductive strips.

20. A heterojunction solid state optical frequency radiation device including at least two different types of semiconductor materials united together to form a heterojunction semiconductor body, one of said at least two different types of semiconductor materials forming an injector region and the other of said at least two different types of semiconductor materials forming a base region, the base region having a different type of conductivity than said injector region, said semiconductor material forming said injector region having a larger forbidden band gap than said semiconductor material forming said base region, said injector region being more heavily doped than said base region, said injector and base regions being physically interrelated relative to each other and provided with bias means for injecting carriers from said injector region into said base region such that carrier accumulation in said base region exceeds levels in excess of the doping level of said injector region while inhibiting carrier run-off from said base region into said injector region such that stimulated emission of radiation occurs in said device, said injector region being disposed on opposite sides of said base region, said injector region having the same type of conductivity on both sides of said base region for injecting the same type of carriers into said base region.

References Cited by the Examiner

UNITED STATES PATENTS

| | | | |
|---|---|---|---|
| 2,776,367 | 1/1957 | Lehovec | 317—235 |
| 3,018,426 | 1/1962 | Ruppel | 317—235 |
| 3,209,215 | 9/1965 | Esaki | 317—235 |
| 3,211,970 | 10/1965 | Christian | 317—235 |
| 3,245,002 | 4/1966 | Hall | 317—235 |
| 3,248,669 | 4/1966 | Dumke et al. | 317—235 |

OTHER REFERENCES

IBM Journal of Research and Development, "Germanium-Gallium Arsenide Heterojunctions," by Anderson, July 1960, pages 283–287 relied on.

JOHN W. HUCKERT, *Primary Examiner.*

J. D. CRAIG, *Assistant Examiner.*